(12) United States Patent
Kim et al.

(10) Patent No.: US 8,581,650 B2
(45) Date of Patent: Nov. 12, 2013

(54) DUTY CYCLE CORRECTION CIRCUIT AND DELAY LOCKED LOOP CIRCUIT INCLUDING THE SAME

(75) Inventors: Ki Han Kim, Icheon-si (KR); Ja Beom Koo, Icheon-si (KR)

(73) Assignee: SK Hynix Inc., Hyeonggi-do (KR)

( * ) Notice: Subject to any disclaimer, the term of this patent is extended or adjusted under 35 U.S.C. 154(b) by 0 days.

(21) Appl. No.: 13/563,863

(22) Filed: Aug. 1, 2012

(65) Prior Publication Data

US 2013/0154702 A1 Jun. 20, 2013

(30) Foreign Application Priority Data

Dec. 19, 2011 (KR) .................. 10-2011-0137485

(51) Int. Cl.
*H03K 3/017* (2006.01)

(52) U.S. Cl.
USPC ............. 327/175; 327/158; 327/156; 327/35

(58) Field of Classification Search
USPC ................ 327/175, 156, 158, 31–38; 326/29
See application file for complete search history.

(56) References Cited

U.S. PATENT DOCUMENTS

| 6,967,514 | B2 * | 11/2005 | Kizer et al. | 327/175 |
|---|---|---|---|---|
| 7,292,082 | B2 * | 11/2007 | Nam et al. | 327/175 |
| 7,876,138 | B2 | 1/2011 | Kobayashi et al. | |
| 7,915,939 | B2 * | 3/2011 | Jang et al. | 327/175 |
| 8,390,364 | B2 * | 3/2013 | Kim et al. | 327/530 |
| 2011/0298513 | A1 * | 12/2011 | Na et al. | 327/175 |

* cited by examiner

*Primary Examiner* — Lincoln Donovan
*Assistant Examiner* — Thomas Skibinski
(74) *Attorney, Agent, or Firm* — William Park & Associates Patent Ltd.

(57) ABSTRACT

A duty cycle correction circuit includes: a duty cycle correction unit configured to correct a duty cycle of an input clock signal according to a duty cycle correction code and generate an output clock signal; a duty cycle detection section configured to detect a duty cycle of the output clock signal and generate an up-down signal; a noise detection signal generation section configured to detect a variation of the up-down signal and generate the noise detection signal; and a duty cycle correction control unit configured to generate the duty cycle correction code in response to the noise detection signal and the up-down signal.

19 Claims, 7 Drawing Sheets

DUTY CYCLE CORRECTION CIRCUIT AND DELAY LOCKED LOOP CIRCUIT INCLUDING THE SAME

CROSS-REFERENCES TO RELATED APPLICATION

The present application claims priority under 35 U.S.C. §119(a) to Korean application number 10-2011-0137485 filed on Dec. 19, 2011, in the Korean Intellectual Property Office, which is incorporated herein by reference.

BACKGROUND

1. Technical Field

The present invention relates generally to a semiconductor apparatus, and more particularly to a duty cycle correction circuit and a delay locked loop (DLL) circuit including the same.

2. Related Art

A duty cycle of a clock signal indicates a ratio of a time corresponding to a high level period to a time corresponding to a low level period during one cycle of the clock signal. In an integrated circuit operated in synchronization with a clock signal such as a semiconductor integrated circuit, it is very important to maintain a duty cycle of a clock signal at 50:50. That is because, when a duty cycle of a clock signal is not accurately controlled in a synchronous semiconductor apparatus which inputs/outputs data in synchronization with the clock signal, data may be distorted.

FIG. 1 illustrates a known duty cycle correction circuit.

The duty cycle correction circuit includes a duty cycle correction unit 1, a duty cycle detection unit 2, and a control unit 3. The duty cycle detection unit 2 is configured to detect a duty cycle of an output clock signal CLKOUT and output an up-down signal UP_DN, and the control unit 3 is configured to output a duty cycle correction code DCC_CODE in response to the up-down signal UP_DN, according to a counting pulse signal CNT_pulse which is a pulse signal. The duty cycle correction unit 1 is configured to correct the duty cycle of the input clock signal CLKIN according to the duty cycle correction code DCC_CODE, and output the corrected signal as the output clock signal CLKOUT. The method of controlling up/down of signal may include a method in which the level of one signal is classified into a high level and a low level so as to control up/down or a method in which two signals are used to control up/down. Therefore, the up-is down signal UP_DN may be generated according to such methods. In various known duty cycle correction circuits, the method in which the level of one signal is classified into a high level and a low level so as to control up/down is used. However, it is difficult to continuously maintain a state in which the duty cycle is controlled at 50:50. Therefore, the up-down signal UP_DN varies with time between a high level and a low level.

When a high-level period of the output clock signal CLK-OUT is larger than a low-level period thereof, the duty cycle correction unit 1 should reduce the high-level period and increase the low-level period. Therefore, the duty cycle detection unit 2 generates the low-level up-down signal UP_DN, and the control unit 3 decreases the value of the duty cycle correction code DCC_CODE in response to the low-level up-down signal UP_DN and the counting pulse signal CNT_pulse. The duty cycle correction unit 1 receives the decreased duty correction code DCC_CODE, and corrects the duty cycle by reducing the high-level period of the input clock signal CLKIN and increasing the low-level period of the input clock signal CLKIN.

The duty cycle correction circuit may be set to be always enabled by activating the counting pulse signal CNT_pulse at all times. In some cases, the duty cycle correction circuit may be set to be selectively enabled by selectively activating the counting pulse signal CNT_pulse.

When the duty cycle is corrected, it is necessary to discriminate whether a variation of the duty cycle per unit time is small or large. The case in which the variation is large is defined as high-frequency noise, and the case in which the variation is small is defined as low-frequency noise. When the duty cycle correction circuit is always enabled, the duty cycle correction circuit may exhibit excellent distortion correction ability for the low-frequency noise, but may cause bang bang jitter for the high-frequency noise.

Therefore, there is a demand for a duty circuit correction circuit capable of detecting a variation of a duty cycle to control the enable of the duty circuit correction circuit.

SUMMARY

In an embodiment of the present invention, a duty cycle correction circuit includes: a duty cycle correction unit configured to correct a duty cycle of an input clock signal according to a duty cycle correction code and generate an output clock signal; a detection unit configured to generate an up-down signal by detecting a duty cycle of the output clock signal and generate a noise detection signal by detecting a variation in duty cycle of the output clock signal; and a duty cycle correction control unit configured to generate the duty cycle correction code in response to the noise detection signal and the up-down signal.

In an embodiment of the present invention, a duty cycle correction circuit includes: a duty cycle correction unit configured to correct a duty cycle of an input clock signal according to a duty cycle correction code and generate an output clock signal; a duty cycle detection unit configured to detect a duty cycle of the output clock and generate a detection voltage and an up-down signal; a voltage detection unit configured to generate an input noise signal according to the level of the detection voltage; a noise detection signal generation unit configured to detect a variation of the input noise signal and generate a noise detection signal; and a duty cycle correction control unit configured to generate the duty cycle correction code in response to the noise detection signal and the up-down signal.

In an embodiment of the present invention, a DLL circuit includes: a variable delay unit configured to adjust a delay amount of an external clock signal according to a phase detection signal and output a DLL clock signal; a delay model unit configured to receive the DLL clock signal and generate a feedback clock signal by delaying the DLL clock signal by a model delay value; a feedback phase comparison unit configured to compare phases of the feedback clock signal and the external clock signal and generate the phase detection signal according to the comparison result; a detection unit configured to generate an up-down signal by detecting a duty cycle of the DLL clock signal, and generate a noise detection signal by detecting a variation in duty cycle of the DLL clock signal; a duty cycle correction control unit configured to generate a duty cycle correction code in response to the noise detection signal and the up-down signal; and a duty cycle correction unit configured to correct a duty cycle of the external clock signal according to the duty cycle correction code.

In an embodiment of the present invention, a DLL circuit includes: a variable delay unit configured to adjust a delay amount of an external clock signal according to a phase detection signal and output a DLL clock signal; a model delay unit configured to receive the DLL clock signal and generate a feedback clock signal by delaying the DLL clock signal by a model delay value; a feedback phase comparison unit configured to compare phases of the feedback clock signal and the external clock signal and generate the phase detection signal according to the comparison result; a duty cycle detection unit configured to detect a duty cycle of the DLL clock and generate a detection voltage and an up-down signal; a voltage detection unit configured to generate an input noise signal according to the level of the detection voltage; a noise detection signal generation unit configured to detect a variation of the input noise signal and generate a noise detection signal; a duty cycle correction control unit configured to generate a duty cycle correction code in response to the noise detection signal and the up-down signal; and a duty cycle correction unit configured to correct a duty cycle of the external clock signal according to the duty cycle correction code.

BRIEF DESCRIPTION OF THE DRAWINGS

Features, aspects, and embodiments are described in conjunction with the attached drawings, in which.

DETAILED DESCRIPTION

Hereinafter, a duty cycle correction circuit and a DLL circuit including the same according to the present invention will be described below with reference to the accompanying drawings through exemplary embodiments.

Figure 1:
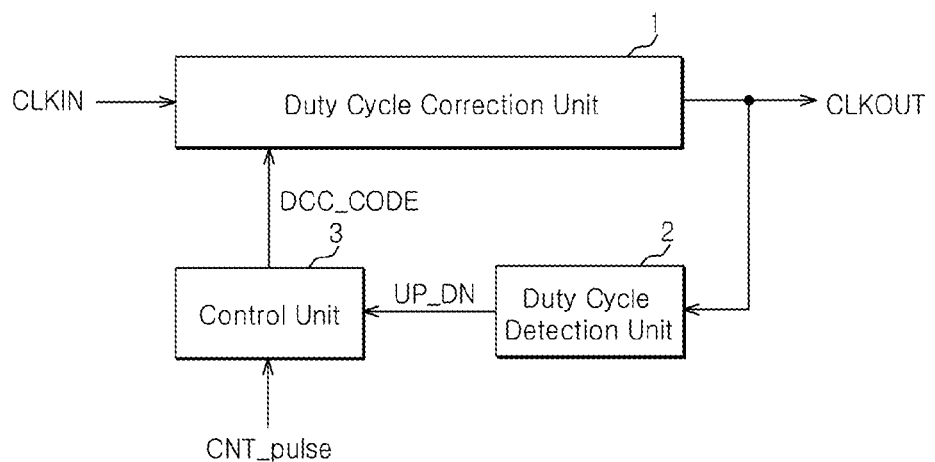
FIG. 1 is circuit diagram of a known duty cycle correction circuit.
Figure 2:
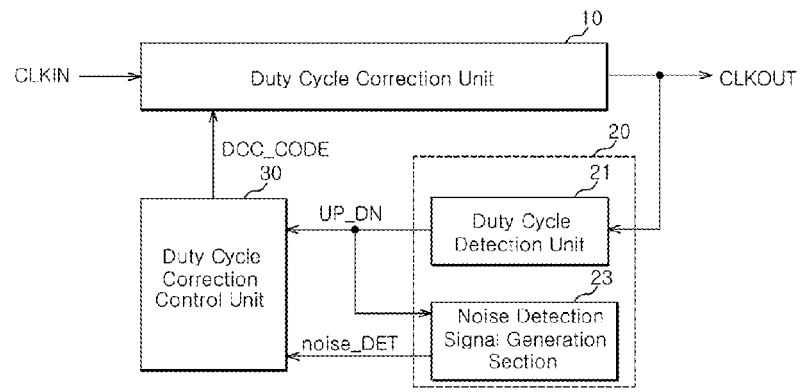
FIG. 2 is a circuit diagram of a duty cycle correction circuit according to an embodiment of the present invention.

FIG. 2 is a circuit diagram of a duty cycle correction circuit according to an embodiment of the present invention.

The duty cycle correction circuit includes a duty cycle correction unit 10, a detection unit 20, and a duty cycle correction control unit 30.

The duty cycle correction unit 10 is configured to correct a duty cycle of an input clock signal CLKIN in response to a duty cycle correction code DCC_CODE, and generate an output clock signal CLKOUT.

The detection unit 20 is configured to generate an up-down signal UP_DN by detecting the duty cycle of the output clock signal CLKOUT, and generate a noise detection signal noise_DET by detecting a variation in duty cycle of the output clock signal CLKOUT. In an embodiment of the present invention, a high level period and a low level period of the output clock signal CLKOUT are compared and whether the up-down signal UP_DN is output at a high level or low level is determined depending on the comparison result, and up/down of the duty cycle. The duty cycle does not always have a constant value, but may vary. The noise detection signal noise_DET may include information as to whether a variation of the duty cycle per unit time is large or small.

The duty cycle correction control unit 30 is configure to generate the duty cycle correction code DCC_CODE in response to the up-down signal UP_DN and the noise detection signal noise_DET. According to the level of the noise detection signal noise_DET, whether or not to enable the duty cycle correction unit 30 is determined. When the duty cycle correction control unit 30 is enabled, the duty cycle correction control unit 30 generates the duty cycle correction code DCC_CODE in response to the up-down signal DP_DN.

For example, when the high-level noise detection signal noise_DET is inputted, the duty cycle correction control unit 30 is disabled and the duty cycle correction code DCC_CODE would not be generated. On the other hand, when the low-level noise detection signal noise_DET is inputted, the duty cycle correction control unit 30 is enabled to generate the duty cycle correction code DCC_CODE according to the level of the up-down signal UP_DN.

That is, the duty cycle correction circuit according to an embodiment of the present invention may control the generation of the duty cycle control code DCC_CODE according to the variation in duty cycle of the output clock signal CLKOUT, thereby controlling the duty cycle correction of the input clock signal CLKIN.

Specifically, the detection unit 20 includes a duty cycle detection section 21 and a noise detection signal generation section 23.

The duty cycle detection section 21 is configured to detect the duty cycle of the output clock signal CLKOUT and generate the up-down signal UP_DN. For example, when the high level period of the output clock signal CLKOUT is larger than the low level period thereof, the low-level up-down signal UP_DN is generated to reduce the high-level period, and when the low level period of the output clock signal CLKOUT is larger than the high level period thereof, the high-level up-down signal DP_DN is generated to increase the high level period. Because it is difficult to continuously maintain a state where the duty cycle is controlled at 50:50, the up-down signal UP_DN continuously varies between the high level and the low level. The duty cycle detection unit 21 may be implemented according to the known duty cycle correction circuit.

The noise detection signal generation section 23 is configured to detect the variation of the up-down signal UP_DN and generate the noise detection signal noise_DET. For example, when the high level period of the clock signal is larger than the low level period, the up-down signal UP_DN may be set at a low level, and when the low level period of the clock signal is larger than the high level period, the up-down signal UP_DN may be set at a high level. The noise detection signal generation section 23 detects a variation in level of the up-down signal UP_DN per unit time. For example, the noise detection signal generation section 23 detects whether or not the up-down signal UP_DN changes more quickly than a predetermined standard, and outputs the detection result as the noise detection signal noise_DET. In other words, when the level of the up-down signal UP_DN changes more quickly than the predetermined standard, the noise detection signal generation section 23 outputs the high-level noise detection signal noise_DET, and when the level of the up-down signal UP_DN changes more slowly than the predetermined standard, the noise detection signal generation section 23 outputs the low-level noise detection signal noise_DET. The detailed configuration of the noise detection signal generation section 23 will be described below.

The duty cycle correction circuit according to an embodiment of the present invention is characterized in that the variation in duty cycle of the output clock signal CLKOUT is detected by detecting the variation of the up-down signal UP_DN, in order to control the operation of the duty cycle correction circuit.

Figure 3:
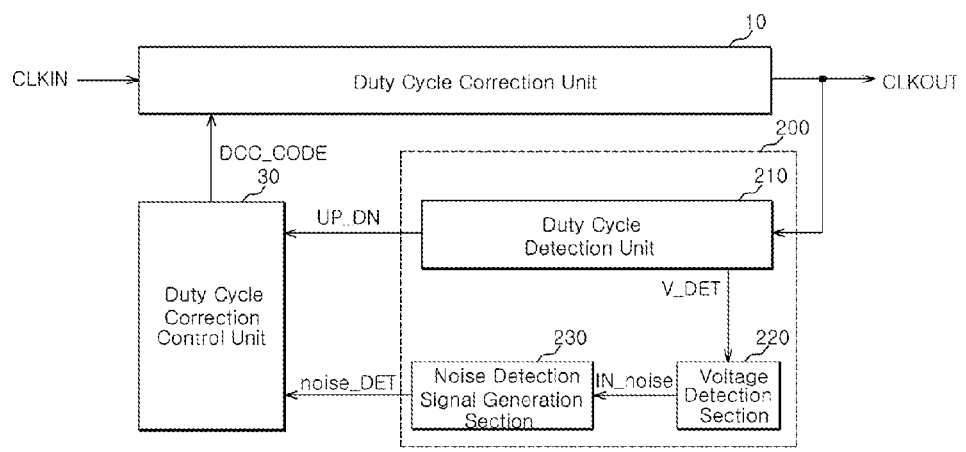
FIG. 3 is a circuit diagram of a duty cycle correction circuit according to an embodiment of the present invention.

FIG. 3 is a circuit diagram of a duty cycle correction circuit according to an embodiment of the present invention.

The duty cycle correction circuit includes a duty cycle correction unit 10, a detection unit 200, and a duty cycle correction control unit 30. The detection unit 200 includes a duty cycle detection section 210, a voltage detection section 220, and a noise detection signal generation section 230.

The configurations and operations of the duty cycle correction unit 10 and the duty cycle correction control unit 30 are the same as those described with reference to FIG. 2.

The duty cycle detection section 210 is configured to detect a duty cycle of an output clock signal CLKOUT and generate an up-down signal UP_DN and a detection voltage V_DET. The configuration for generating the up-down signal UP_DN by detecting the duty cycle may be implemented using various circuits. The detection voltage V_DET is a voltage having a positive value, and generated by charging a voltage during a high level period of the output clock signal and discharging the voltage during a low level period of the output clock. That is, the level of the detection voltage V_DET indicates a duty cycle. When the high level period of the output clock signal CLKOUT is larger than the low level period, the detection voltage V_DET having a high level is generated, and when the low level period of the output clock signal CLKOUT is larger than the high level period, the detection voltage V_DET having a low level is generated. This configuration may be implemented using a charge-pumping method.

The voltage detection section 220 is configured to generate an input noise signal IN_noise according to the level of the detection voltage V_DET. That is, the level of the detection voltage V_DET may vary, e.g., have a higher or lower value than a specific level, and the voltage detection section 220 may detect the level of the detection voltage V_DET and convert the detection voltage V_DET into the input noise signal IN_noise which is a digital signal. The detailed configuration of voltage detection section 220 will be described below.

The noise detection signal generation section 230 is configured to generate a noise detection signal noise_DET in response to the input noise signal IN_noise. The input noise signal IN_noise may vary, e.g., have a high or low level according to the level of the detection voltage V_DET, and the noise detection signal generation section 230 detects a variation in level of the input noise signal IN_noise per unit time, that is, whether or not the level of the input noise signal IN_noise changes more quickly than a predetermined standard, and output the detection result as the noise detection signal noise_DET. That is, when the level of the input noise signal IN_noise changes more quickly than the predetermined standard, the noise detection signal generation section 230 outputs the high-level noise detection signal noise_DET, and when the level of the input noise signal IN_noise changes more slowly than the predetermined standard, the noise detection signal generation section 230 outputs the low-level noise detection signal noise_DET. The noise detection signal generation section 230 may be configured in a similar manner to the noise detection signal generation section 23 described with reference to FIG. 2, and the detailed configuration thereof will be described below.

The duty cycle correction circuit according to an embodiment of the present invention converts the level of the detection voltage V_DET into the input noise signal IN_noise based on a specific level, and generates the noise detection signal noise_DET by detecting the variation of the input noise signal IN_noise. The specific level may include a level based on the duty cycle of 50:50 as in FIG. 2 or a different level.

In some cases, when noise of the duty cycle is detected and corrected on the basis of a duty cycle of 60:40 or 40:60 in consideration of a margin of the duty cycle, it may be more efficient for the circuit. In an embodiment of the present invention, when the noise of the duty cycle is detected, an optimal reference level may be set to be a duty cycle other than 50:50.

Figure 4:
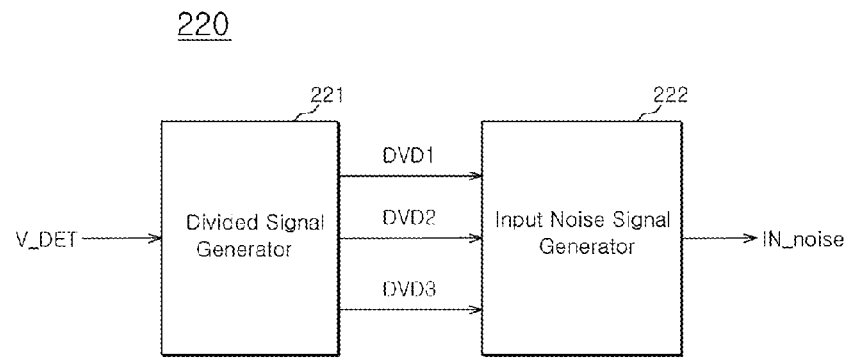
FIG. 4 is a circuit diagram of a voltage detection section of FIG. 3.

FIG. 4 is a circuit diagram of the voltage detection section 220.

The voltage detection section 220 includes a divided signal generator 221 and an input noise signal generator 222.

The divided signal generator 221 is configured to receive the detection signals V_DET and generate a plurality of divided signals DVD1, DVD2, and DVD3 having values corresponding to the level of the detection voltage V_DET. For example, when the level of the detection voltage V_DET is very high, the divided signal generator 221 may generate the divided signals DVD1, DVD2, and DVD3 of 1, 1 and 1, and when the level of the detection voltage V_DET becomes low, the divided signal generator 221 may generate the divided signals DVD1, DVD2, and DVD3 of 0, 1 and 1. Furthermore, when the level of the detection voltage V_DET becomes lower, the divided signal generator 221 may generate the divided signals DVD1, DVD2, and DVD3 of 0, 0 and 1, and when the level of the detection voltage V_DET is the lowest, the divided signal generator 221 may generate the divided signals DVD1, DVD2, and DVD3 of 0, 0 and 0. The number of the divided signals may be properly adjusted by a user.

The input noise signal generator 222 is configured to perform a logical operation on the divided signals DVD1, DVD2, and DVD3, and output the operation result as the input noise signal IN_noise. Here, the input noise signal generator 222 may be configured to output a specific bit value of the operation result. The selected specific bit serves as a reference for determining a specific level of the detection voltage V_DET for detecting duty cycle noise. For example, if the operation result consists of two bits and the upper bit value is outputted as the input noise signal IN_noise, the level of the detection voltage V_DET, serving as a standard of variation in the upper bit value, becomes the reference voltage.

Figure 5:
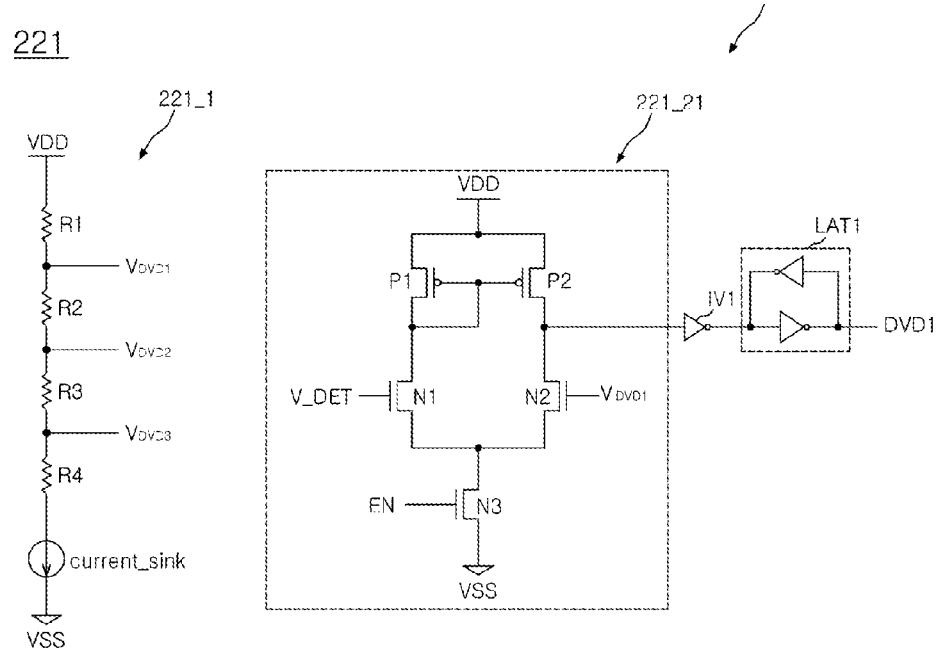
FIG. 5 is a circuit diagram of a divided signal generator of FIG. 4.

FIG. 5 is a circuit diagram of the divided signal generator 221.

The divided signal generator 221 includes a divided voltage generator 221_1 and a plurality of voltage comparators 221_2.

The divided voltage generator 221_1 includes a current sink current_sink coupled between an external voltage VDD and a ground voltage VSS, and is configured to divide a voltage level using a plurality of resistors R1, R2, R3, and R4 and generate first to third divided voltages VDVD1 to VDVD3. The first to third divided voltages VDVD1 to VDVD3 are required for determining the level of the detection voltage V_DET and generating the divided signals DVD1 to DVD3 corresponding to the level of the detection voltage V_DET.

The number of the voltage comparators 221_2 may correspond to the number of the divided voltages VDVD1 to VDVD3. That is because the detection voltage V_DET is compared to the plurality of divided voltages VDVD1 to VDVD3 so as to generate the plurality of divided signals DVD1 to DVD3. In an embodiment of the present invention, three voltage comparators are provided, and the following descriptions will be focused on the voltage comparator 221_2 using the first divided voltage VDVD1.

The voltage comparator 221_2 includes a current mirror 221_21 enabled according to an enabled signal EN and configured to receive the detection signal V_DET and the first divided voltage VDVD1. In addition, the voltage comparator 221_2 may include a first inverter IN1 and a first latch LAT1 configured to drive an output of the current mirror 221_21. The current mirror 221_21 includes a pair of PMOS transistors P1 and P2, a pair of NMOS transistors N1 and N2 configured to receive the detection voltage V_DET and the first divided voltage VDVD1, respectively, and a third NMOS transistor N3 configured to receive the enable signal EN and coupled between a ground terminal and the NMOS transistors N1 and N2.

Specifically, when the enable signal EN is activated and the level of the detection voltage V_DET is higher than the first divided voltage VDVD1, the current mirror 221_21 outputs a high level, and the high-level first divided signal DVD1 is generated. On the other hand, when the level of the detection voltage V_DET is lower than the first divided voltage VDVD1, the low-level first divided signal DVD1 is generated.

The second and third divided voltages DVD2 and DVD3 are also generated using the second and third divided voltages VDVD2 and VDVD3, respectively, according to the above-described method. The first to third divided signals DVD1 to DVD3 may have four state values of 111, 011, 001 and 000, according to the level of the detection voltage V_DET. The four state values may be obtained by dividing the level of the detection voltage V_DET into four regions.

Figure 6:
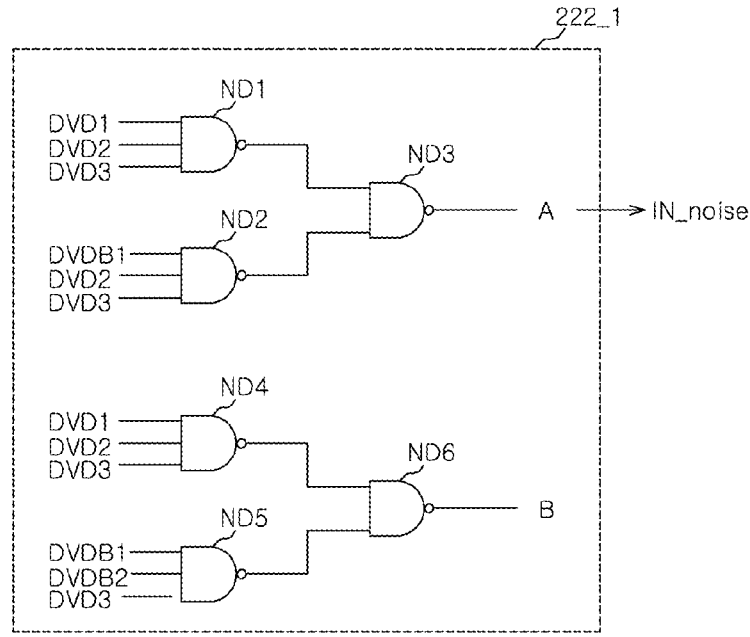
FIG. 6 is a circuit diagram of an input noise signal generator of FIG. 4.

FIG. 6 is a circuit diagram of the input noise signal generator 222.

The input noise signal generator 222 includes a converter 222_1 configured to convert the four state values of the first to third divided signals DVD1 to DVD3 into a two-bit combination signal AB. Since the two-bit combination signal AB may have four states of 11, 10, 01 and 00, the combination signal AB may represent all of the states of the first to fourth divided signals DVD1 to DVD3.

Specifically, the converter 222_1 includes first to sixth NAND gates ND1 to ND6.

The first NAND gate ND1 is configured to perform a NAND operation on the first divided signal DVD1, the second divided signal DVD2, and the third divided signal DVD3, and the second NAND gate ND2 is configured to perform a NAND operation on an inverted signal of the first divided signal DVD1, the second divided signal DVD2, and the third divided signal DVD3. The fourth NAND gate ND4 is configured to perform a NAND operation on the first divided signal DVD1, the second divided signal DVD2, and the third divided signal DVD3, and the fifth NAND gate ND5 is configured to perform a NAND operation on the inverted signal of the first divided signal DVD1, an inverted signal of the second divided signal DVD2, and the third divided signal DVD3. Furthermore, the third NAND gate ND3 is configured to perform a NAND operation on outputs of the first and second NAND gates ND1 and ND2 and generate a bit A corresponding to the upper bit of the combination signal AB, and the sixth gate NAND gate ND6 is configured to perform a NAND operation on outputs of the fourth and fifth NAND gates ND4 and ND5 and generate a bit B corresponding to the lower bit of the combination signal AB.

According to an embodiment of the present invention, the converter 222_1 may convert the states (i.e., 111, 011, 001, and 000) of the first to third divided signals DVD1 to DVD3 into the combination signals AB of 11, 10, 01 and 00, respectively.

Then, the input noise signal generator 222 outputs the upper bit value of the combination signal AB as the input noise signal IN_noise. When the upper bit A is outputted as the input noise signal IN_noise, the combination signal AB of 11 and 10 is outputted as the high-level input noise signal IN_noise, and the combination signal AB of 01 and 00 is outputted as the low-level input noise signal IN_noise.

In an embodiment of the present invention, the detection voltage V_DET is divided into four states, using three divided voltages VDVD1 to VDVD3. However, the detection voltage V_DET may be divided into three, five or more states, using a larger number of divided voltages and combination methods. Furthermore, a user may select a desired bit value according to the above-described method, and the selected bit value may be outputted as the input noise signal IN_noise. In an embodiment of the present invention, when the noise of the duty cycle is detected, an optimal reference level may be set according to a given condition, instead of the duty cycle of 50:50.

Figure 7:
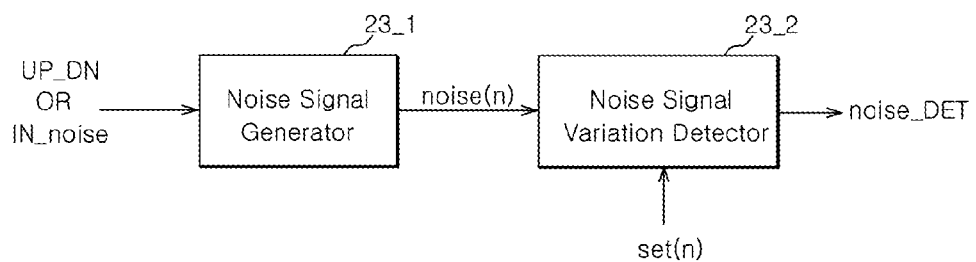
FIG. 7 is a circuit diagram of noise detection signal generation sections of FIGS. 2 and 3.

FIG. 7 is a circuit diagram of the noise detection signal generation sections 23 and 230 of FIGS. 2 and 3.

The noise detection signal generation sections 23 and 230 of FIGS. 2 and 3 may have the same configuration, except for whether the up-down signal UP_DN or the input noise signal IN_noise is received. Therefore, the noise detection signal generation section 23 of FIG. 2 will be first described. Then, the noise detection signal generation section 230 of FIG. 3 will be described.

The noise detection signal generation section 23 of FIG. 3 receives the up-down signal UP_DN whose level varies with time, and generates the noise detection signal noise_DET according to a result obtained by detecting the variation of the up-down signal UP_DN. The noise detection signal generation section 23 includes a noise signal generator 23_1 and a noise signal variation detector 23_2.

The noise signal generator 23_1 is configured to determine whether the level of the up-down signal UP_DN is varying or not, for each predetermined period, and generate a plurality of noise signals noise(n). That is, when the level of the up-down signal UP_DN varies while high-level noise signals noise(1, 2 . . . ) are generated, low-level noise signals noise( . . . n-1, n) are generated.

The noise signal variation detector 23_2 is configured to compare the levels of the plurality of noise signals noise(n) to the levels of a plurality of set signals set(n), and generate the noise detection signal noise_DET. The noise detection signal noise_DET serves to detect whether a variation of a duty cycle per unit time is large or small. For example, whether or not the noise signal noise(n) changes more quickly than a reference set by the set signal set(n) may be detected.

Figure 8:
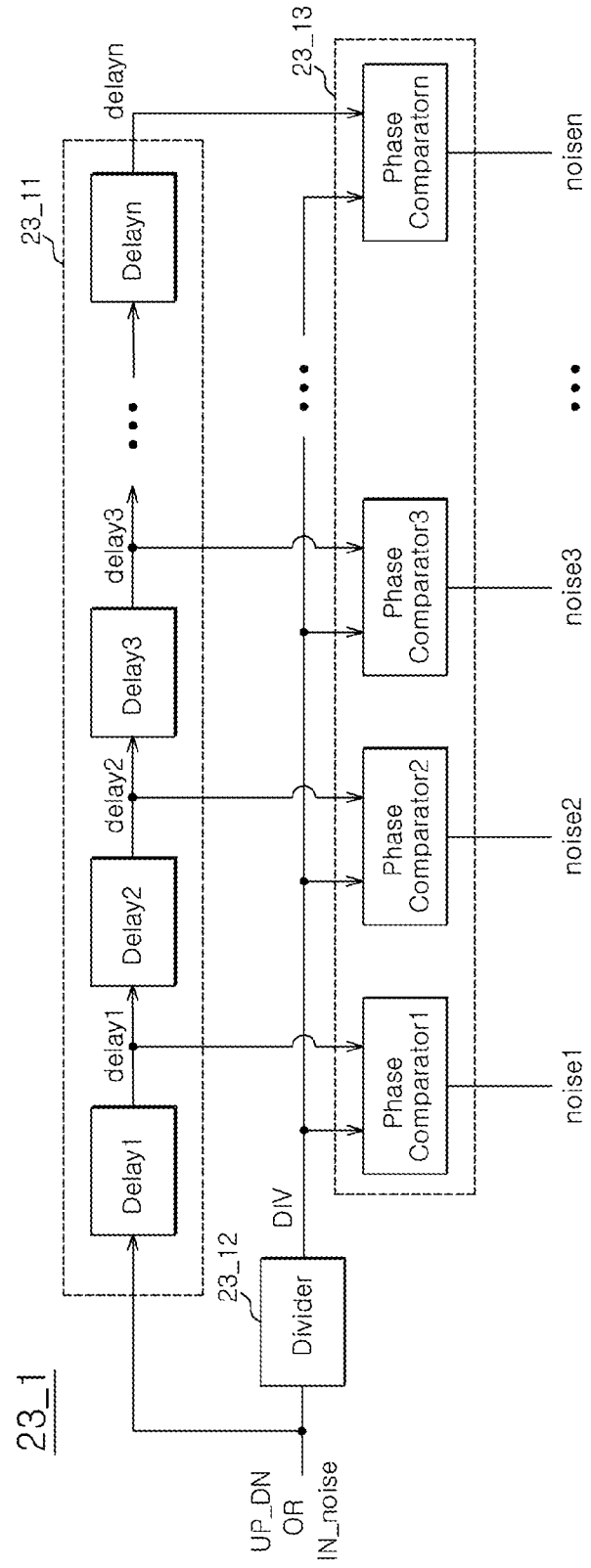
FIG. 8 is a circuit diagram of a noise signal generator of FIG. 7.

FIG. 8 is a circuit diagram of the noise signal generator 23_1.

The noise signal generator 23_1 includes a plurality of delays 23_11, a divider 23_12, and a plurality of phase comparators 23_13.

The plurality of delays 23_11 are configured to delay the up-down signal UP_DN by a predetermined unit time and generate a plurality of delayed signals delay(n).

The divider 23_12 is configured to divide the cycle of the up-down signal UP_DN by a predetermined multiple of a certain number and output a divided signal DIV.

The phase comparators 23_13 are configured to compare the phase of the divided signal DIV to the phases of the plurality of delayed signals delay(n), and generate the plurality of noise signals noise(n). The phase comparators 23_13 generate the high-level noise signals noise(n) when the divided signal DIV is at a high level, and generate the low-level noise signals noise(n) when the divided signal DIV is at a low level, at rising clocks of the plurality of delayed signals delay(n). That is, the variation of the divided signal DIV of the up-down signal UP_DN may be checked at each time when the up-down signal UP_DN is delayed by each of the delays 23_11. The noise signal noise(n) has a high level in the initial state of the operation, but changes to a low level when the divided signal DIV is changed to a low level.

Figure 9:
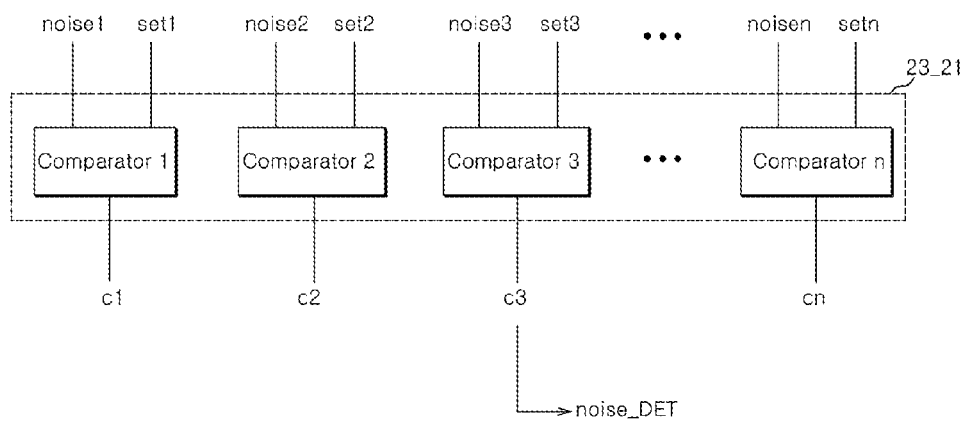
FIG. 9 is a circuit diagram of a noise signal variation detector of FIG. 7.

FIG. 9 is a circuit diagram of the noise signal variation detector 23_2.

The noise signal variation detector 23_2 includes a plurality of comparators 23_21.

The plurality of comparators 23_21 are configured to compare each of the noise signals noise(n) to the set signals set(n), respectively. The set signal set(n) defines a standard for a variation of the noise signal noise(n), in order to set a standard of the variation in duty cycle. For example, when the first and second set signals set1 and set2 are set at high levels and the third set signal set3 is set at a low level, a third comparison signal may be compared to the third set signal set3. In this case, when the third comparison signal is equal to the third set signal set3, it is determined that the noise signal noise(n) changes quickly. On the other hand, when the third comparison signal is different from the third set signal set3, it is determined that the noise signal noise(n) changes slowly. That is, the former case corresponds to a case in which the variation per unit time is large, and the latter case corresponds to a case in which the variation per unit time is small. As such, when the third set signal set3 is a reference to be compared, the third comparison signal is outputted as the noise detection signal noise_DET, and when the n-th set signal set(n) is a reference to be compared, an n-th comparison signal is outputted as the noise detection signal noise_DET.

When it is determined that the noise signal noise(n) changes quickly, the high-level noise detection signal noise_DET may be generated, and when it is determined that the noise signal noise(n) changes slowly, the low-level noise detection signal noise_DET may be generated.

The operation of the noise detection signal generation section 230 of FIG. 3 may be the same as that of the noise detection signal generation section 23 of FIG. 2, except that the noise detection signal generation section 23 of FIG. 2 detects the variation of the up-down signal UP_DN, but the noise detection signal generation section 230 of FIG. 3 detects the variation of the input noise signal IN_noise. Therefore, the detailed configuration of the noise detection signal generation section 230 of FIG. 3 will be omitted herein.

Figure 10:
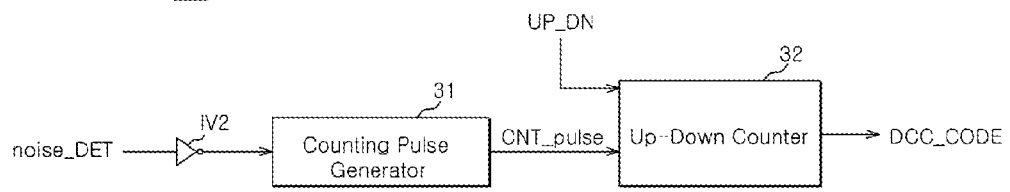
FIG. 10 is a circuit diagram of a duty cycle correction control unit of FIG. 2.

FIG. 10 is a circuit diagram of the duty cycle correction control unit 30 of FIG. 2.

The duty cycle correction control unit 30 includes a second inverter IV2, a counting pulse generator 31, and an up-down counter 32.

The second inverter IV2 is configured to invert the noise detection signal noise_DET and output the inverted noise detection signal noise_DET to the counting pulse generator 31.

The counting pulse generator 31 is, for example, disabled when the noise detection signal noise_DET is at a high level, and enabled when the noise detection signal noise_DET is at a low level, thereby generating a counting pulse signal CNT_pulse.

The up-down counter 32 is configured to generate the duty cycle correction code DCC_CODE in response to the up-down signal UP_DN according to the counting pulse signal CNT_pulse.

That is, when the counting pulse generator 31 is enabled to generate the counting pulse signal CNT_pulse, the up-down counter 32 increases or decreases the duty correction code DCC_CODE according to the level of the up-down signal UP_DN, for example, in synchronization with the counting pulse signal CNT_pulse.

In an embodiment of the present invention, the duty cycle correction circuit may be enabled, e.g., always or selectively, according to the variation of the duty cycle, which makes it possible to perform duty cycle correction optimized to each condition.

Furthermore, the duty cycle correction circuit may be used in a DLL circuit which compensates for a clock skew generated by a circuit inside a semiconductor memory apparatus and removes a phase difference between output data and an external clock signal.

Figure 11:
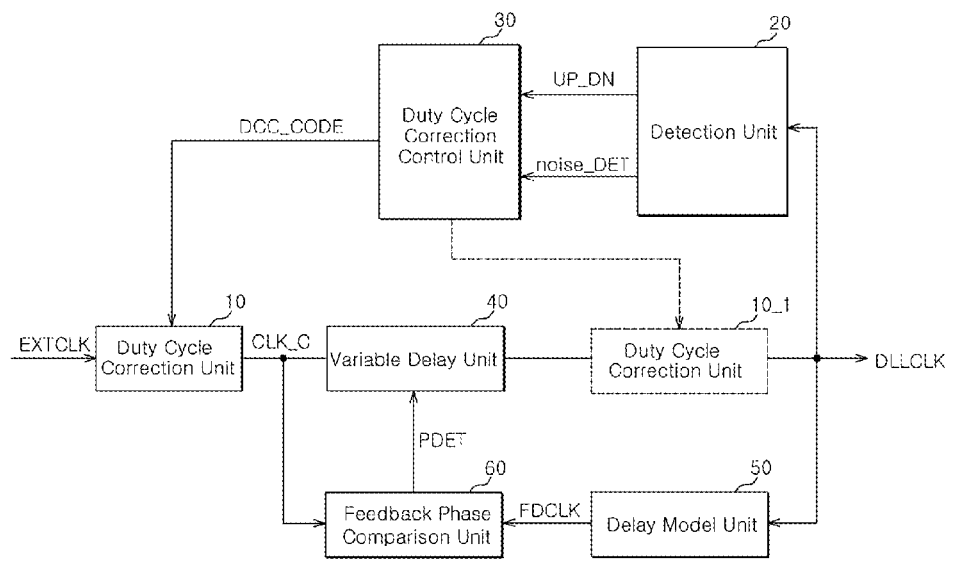
FIG. 11 is a circuit diagram a DLL circuit including the duty cycle correction circuit.

FIG. 11 is a circuit diagram a DLL circuit including the duty cycle correction circuit according to an embodiment of the present invention.

The DLL circuit includes a duty cycle correction unit 10 or 10_1, a detection unit 20, a duty cycle correction control unit 30, a variable delay unit 40, a delay model unit 50, and a feedback phase comparison unit 60.

The duty cycle correction unit 10 or 10_1 may be positioned at the front or rear stage of the DLL circuit.

The duty cycle correction unit 10 or 10_1, the detection unit 20, and the duty cycle correction control unit 30 of the DLL circuit may have the same configurations as those of the above-described duty cycle correction circuit, and perform the same operation.

The variable delay unit 40 is configured to receive an external clock signal EXTCLK, and generate a DLL clock signal DLLCLK by delaying the external clock signal EXTCLK in response to a phase detection signal PDET.

The delay model unit 50 is configured to receive the DLL clock signal DLLCLK, and generate a feedback clock signal FDCLK by delaying the DLL clock signal DLLCLK by a model delay value. The model delay value may be obtained by modeling time delay caused by an internal circuit path.

The feedback phase comparison unit 60 is configured to compare the phases of the external clock signal EXTCLK and the feedback clock signal FBCLK, and generate the phase detection signal PDET according to the comparison result.

The phase detection signal PDET serves to adjust the delay amount of the variable delay unit 40 until the phases of the external clock signal EXTCLK and the feedback clock signal FBCLK are equalized. When the phases of the external clock signal EXTCLK and the feedback clock signal FBCLK are equalized to each other, it means that the variable delay unit 40 generates the DLL clock signal DLLCLK to accurately compensate for the model delay value.

The DLL circuit disables the duty cycle correction circuit, when the variation in duty cycle of the DLL clock signal DLLCLK per unit time is large, that is, when the duty cycle changes quickly, and enables the duty cycle correction circuit when the variation in duty cycle of the DLL clock signal DLLCLK per unit time is small, that is, when the duty cycle changes slowly. Therefore, the DLL circuit may efficiently correct the duty cycle of the DLL clock signal DLLCLK according to the variation in duty cycle of the DLL clock signal DLL.

As such, when the DLL circuit generates the DLL clock signal DLLCLK, the DLL circuit may detect the variation in duty cycle of the DLL clock signal DLLCLK and control the enable of the duty cycle correction circuit. Therefore, the DLL circuit may provide an optimized duty cycle correction method.

While certain embodiments have been described above, it will be understood to those skilled in the art that the embodiments described are by way of example only. Accordingly, the duty cycle correction circuit described herein should not be limited based on the described embodiments. Rather, the duty cycle correction circuit described herein should only be limited in light of the claims that follow when taken in conjunction with the above description and accompanying drawings.

What is claimed is:

1. A duty cycle correction circuit comprising:
   a duty cycle correction unit configured to correct a duty cycle of an input clock signal according to a duty cycle correction code and generate an output clock signal;
   a duty cycle detection unit configured to detect a duty cycle of the output clock and generate a detection voltage and an up-down signal;
   a voltage detection unit configured to generate an input noise signal according to the level of the detection voltage;
   a noise detection signal generation unit configured to detect a variation of the input noise signal and generate a noise detection signal; and
   a duty cycle correction control unit configured to generate the duty cycle correction code in response to the noise detection signal and the up-down signal.

2. The duty cycle correction circuit according to claim 1, wherein the voltage detection unit comprises:
   a divided signal generation section configured to compare the level of the detection voltage based on a plurality of divided voltages, and generate a plurality of divided signals; and
   an input noise signal generation section configured to generate a multi-bit combination signal by combining the divided signals, and output an upper bit of the multi-bit combination signal as the input noise signal.

3. The duty cycle correction circuit according to claim 1, wherein the voltage detection unit comprises:
   a divided signal generation section configured to compare the detection voltage level to first to third divided voltages generated by dividing an external voltage level and generate first to third divided signals; and
   an input noise signal generation section configured to combine the first to third divided signals to generate a two-bit combination signal indicating the level of the detection voltage, and output an upper bit of the combination signal as the input noise signal.

4. The duty cycle correction circuit according to claim 1, wherein the noise detection signal generation unit comprises:
   a noise signal generator configured to check whether the level of the input noise signal is varying or not, at each predetermined period, and generate a plurality of noise signals; and
   a noise signal variation detector configured to compare the plurality of noise signals to a plurality of set signals and generate the noise detection signal.

5. The duty cycle correction circuit according to claim 4, wherein the noise signal generator comprises:
   a delay unit configured to delay the input noise signal by a predetermined unit time and generate a plurality of delayed signals;
   a divider configured to divide the cycle of the input noise signal by a predetermined multiple and output a divided signal; and
   a phase comparator configured to compare a phase of the divided signal to phases of the plurality of delayed signals and generate the plurality of noise signals.

6. The duty cycle correction circuit according to claim 5, wherein the phase comparator generates the high-level noise signal when the divided signal is at a high level, and generates the low-level noise signal when the divided signal is at a low level, at rising clocks of the plurality of delayed signals.

7. The duty cycle correction circuit according to claim 4, wherein the noise signal variation detector generates a plurality of comparison signals by comparing the levels of the plurality of noise signals to the levels of the plurality of set signals, and outputs a comparison signal to be detected, among the plurality of comparison signals, as the noise detection signal.

8. The duty cycle correction circuit according to claim 7, wherein the noise signal variation detector generates the activated comparison signal when the levels of the noise signal and the set signal are equal to each other, and generates the deactivated comparison signal when the levels of the noise signal and the set signal are different from each other.

9. The duty cycle correction circuit according to claim 1, wherein the duty cycle correction control unit comprises:
   a counting pulse generator configured to generate a counting pulse signal in response to the noise detection signal; and
   an up-down counter configured to generate the duty cycle correction code according to the up-down signal, in synchronization with the counting pulse signal.

10. The duty cycle correction circuit according to claim 9, wherein the counting pulse generator generates the counting pulse signal when the activated noise detection signal is inputted.

11. A DLL circuit comprising:
    a variable delay unit configured to adjust a delay amount of an external clock signal according to a phase detection signal and output a DLL clock signal;
    a delay model unit configured to receive the DLL clock signal and generate a feedback clock signal by delaying the DLL clock signal by a model delay value;
    a feedback phase comparison unit configured to compare phases of the feedback clock signal and the external clock signal and generate the phase detection signal according to the comparison result;
    a duty cycle detection unit configured to detect a duty cycle of the DLL clock and generate a detection voltage and an up-down signal;
    a voltage detection unit configured to generate an input noise signal according to the level of the detection voltage;
    a noise detection signal generation unit configured to detect a variation of the input noise signal and generate a noise detection signal;
    a duty cycle correction control unit configured to generate a duty cycle correction code in response to the noise detection signal and the up-down signal; and
    a duty cycle correction unit configured to correct a duty cycle of the external clock signal according to the duty cycle correction code.

12. The DLL circuit according to claim 11, wherein the duty cycle correction unit corrects the duty cycle of the DLL clock signal according to the duty cycle correction code.

13. The DLL circuit according to claim 11, wherein the voltage detection unit comprises:
- a divided signal generation section configured to compare the level of the detection voltage based on a plurality of divided voltages, and generate a plurality of divided signals; and
- an input noise signal generation section configured to generate a multi-bit combination signal by combining the divided signals, and output an upper bit of the multi-bit combination signal as the input noise signal.

14. The DLL circuit according to claim 11, wherein the noise detection signal generation unit comprises:
- a noise signal generator configured to check whether the level of the input noise signal is varying or not, at each predetermined period, and generate a plurality of noise signals; and
- a noise signal variation detector configured to compare the plurality of noise signals to a plurality of set signals and generate the noise detection signal.

15. The DLL circuit according to claim 14, wherein the noise signal generator comprises:
- a delay unit configured to delay the input noise signal by a predetermined unit time and generate a plurality of delayed signals;
- a divider configured to divide the cycle of the input noise signal by a predetermined multiple and output a divided signal; and
- a phase comparator configured to compare a phase of the divided signal to phases of the plurality of delayed signals and generate the plurality of noise signals.

16. The DLL circuit according to claim 15, wherein the phase comparator generates the high-level noise signal when the divided signal is at a high level, and generates the low-level noise signal when the divided signal is at a low level, at rising clocks of the plurality of delayed signals.

17. The DLL circuit according to claim 14, wherein the noise signal variation detector generates a plurality of comparison signal by comparing the levels of the plurality of noise signals to the levels of the plurality of set signals, and outputs a comparison signal to be detected, among the plurality of comparison signals, as the noise detection signal.

18. The DLL circuit according to claim 17, wherein the noise signal variation detector generates the activated comparison signal when the levels of the noise signal and the set signal are equal to each other, and generates the deactivated comparison signal when the levels of the noise signal and the set signal are different from each other.

19. The DLL circuit according to claim 11, wherein the duty cycle correction control unit comprises:
- a counting pulse generator configured to generate a counting pulse signal in response to the noise detection signal; and
- an up-down counter configured to generate the duty cycle correction code according to the up-down signal, in synchronization with the counting pulse signal.

* * * * *